US 11,746,863 B2

(12) United States Patent
Arakawa et al.

(10) Patent No.: US 11,746,863 B2
(45) Date of Patent: Sep. 5, 2023

(54) ROTARY-TO-LINEAR MOTION CONVERTER

(71) Applicant: Seiko Epson Corporation, Tokyo (JP)

(72) Inventors: Yutaka Arakawa, Hara (JP); Tomohisa Iwazaki, Shimosuwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 68 days.

(21) Appl. No.: 16/426,413

(22) Filed: May 30, 2019

(65) Prior Publication Data
US 2019/0368584 A1    Dec. 5, 2019

(30) Foreign Application Priority Data
May 31, 2018   (JP) .............................. JP2018-104423

(51) Int. Cl.
*F16H 25/22*      (2006.01)
*F16H 25/20*      (2006.01)
*H10N 30/20*      (2023.01)

(52) U.S. Cl.
CPC ..... *F16H 25/2204* (2013.01); *F16H 25/2006* (2013.01); *F16H 2025/204* (2013.01); *F16H 2025/2075* (2013.01); *F16H 2025/2081* (2013.01); *F16H 2025/2084* (2013.01); *H10N 30/20* (2023.02)

(58) Field of Classification Search
CPC ........ H02N 2/103; H02N 2/026; H02N 2/126; F16H 25/2204; F16H 2025/204; H01L 41/09
USPC ................................................... 310/323.01
See application file for complete search history.

(56) References Cited

U.S. PATENT DOCUMENTS

| 5,053,670 | A | * | 10/1991 | Kosugi | ................. | H02N 2/126 |
| | | | | | | 310/323.03 |
| 5,770,913 | A | * | 6/1998 | Mizzi | ....................... | B25J 5/00 |
| | | | | | | 310/20 |
| 6,288,475 | B1 | * | 9/2001 | Ito | ......................... | H02N 2/147 |
| | | | | | | 310/323.01 |
| 6,979,936 | B1 | * | 12/2005 | Ganor | ................... | B26B 19/28 |
| | | | | | | 310/323.01 |

(Continued)

FOREIGN PATENT DOCUMENTS

| CN | 101087110 A | 12/2007 |
| CN | 203230825 U | 10/2013 |

(Continued)

OTHER PUBLICATIONS

Search Report of the First Office Action CN Application No. 2019104646896 dated Aug. 11, 2021.

*Primary Examiner* — Gregory Robert Weber
(74) *Attorney, Agent, or Firm* — Gang Yu

(57) ABSTRACT

A rotary-to-linear motion converter includes: a drive portion including a vibrating portion vibrating by a piezoelectric body and a convex portion coupled to the vibrating portion; a housing; a rotating member including a first screw portion and a driven surface that contacts the convex portion and that receives driving force of the drive portion, the rotating member pivoting around an axial center relative to the housing; a linearly moving member including a second screw portion threadably engaging with the first screw portion; and a restricting portion that is disposed at the housing and that restricts rotation of the linearly moving member.

6 Claims, 7 Drawing Sheets

(56) References Cited

U.S. PATENT DOCUMENTS

| | | | | |
|---|---|---|---|---|
| 7,015,623 | B2* | 3/2006 | Nitto | H02N 2/16 |
| | | | | 310/323.01 |
| 7,116,037 | B2* | 10/2006 | Moteki | H01L 41/0913 |
| | | | | 310/323.02 |
| 7,355,802 | B2* | 4/2008 | Homme | G03B 3/10 |
| | | | | 310/323.01 |
| 9,341,248 | B2* | 5/2016 | Wu | F16C 29/005 |
| 10,044,295 | B2* | 8/2018 | Kamijo | H02N 2/004 |
| 2004/0027032 | A1 | 2/2004 | Moteki et al. | |
| 2006/0250048 | A1 | 11/2006 | Moteki et al. | |
| 2012/0308355 | A1* | 12/2012 | Yasukawa | H02N 2/004 |
| | | | | 414/729 |
| 2012/0314269 | A1* | 12/2012 | Takano | H02N 2/126 |
| | | | | 359/221.2 |
| 2014/0196555 | A1 | 7/2014 | Wu | |
| 2015/0015104 | A1* | 1/2015 | Kataoka | H02K 1/165 |
| | | | | 310/80 |
| 2017/0001306 | A1 | 1/2017 | Arakawa et al. | |
| 2017/0279378 | A1 | 9/2017 | Kajino et al. | |
| 2017/0350479 | A1* | 12/2017 | Shimizu | B25B 27/20 |
| 2019/0097492 | A1* | 3/2019 | Matsuto | B62D 5/0403 |

FOREIGN PATENT DOCUMENTS

| | | |
|---|---|---|
| JP | H03164075 A | 7/1991 |
| JP | 2004-312814 A | 11/2004 |
| JP | 2005-073320 A | 3/2005 |
| JP | 2017-017916 A | 1/2017 |
| JP | 2017163775 A | 9/2017 |
| JP | 2017184297 A | 10/2017 |
| JP | 2018066434 A | 4/2018 |

* cited by examiner

ROTARY-TO-LINEAR MOTION CONVERTER

The present application is based on, and claims priority from, JP Application Serial Number 2018-104423, filed May 31, 2018, the disclosure of which is hereby incorporated by reference herein in its entirety.

BACKGROUND

1. Technical Field

The present disclosure relates to a rotary-to-linear motion converter.

2. Related Art

A ball screw device with built-in motor disclosed in JP-A-2005-73320 includes a ball screw shaft, a ball screw nut and a ball spline nut that are mounted on the ball screw shaft, a direct drive motor that rotates the ball screw nut to move the ball screw shaft in the axial direction thereof, and a direct drive motor that rotates the ball spline nut to rotate the ball screw shaft around the axis thereof.

JP-A-2005-73320 is an example of the related art.

When a direct drive motor is used for a rotary-to-linear motion converter as in JP-A-2005-73320, it is difficult to miniaturize the direct drive motor itself, which is an electromagnetic motor, and there is a problem in that it is difficult to achieve the miniaturization of the converter.

SUMMARY

A rotary-to-linear motion converter according to an application example of the present disclosure includes: a drive portion including a vibrating portion vibrating by a piezoelectric body and a convex portion coupled to the vibrating portion; a housing; a rotating member including a first screw portion and a driven surface that contacts the convex portion and that receives driving force of the drive portion, the rotating member pivoting around an axial center relative to the housing; a linearly moving member including a second screw portion threadably engaging with the first screw portion; and a restricting portion that is disposed at the housing and that restricts rotation of the linearly moving member.

DESCRIPTION OF EXEMPLARY EMBODIMENTS

Hereinafter, a rotary-to-linear motion converter according to the present disclosure will be described in detail based on embodiments shown in the accompanying drawings.

First Embodiment

Figure 1:
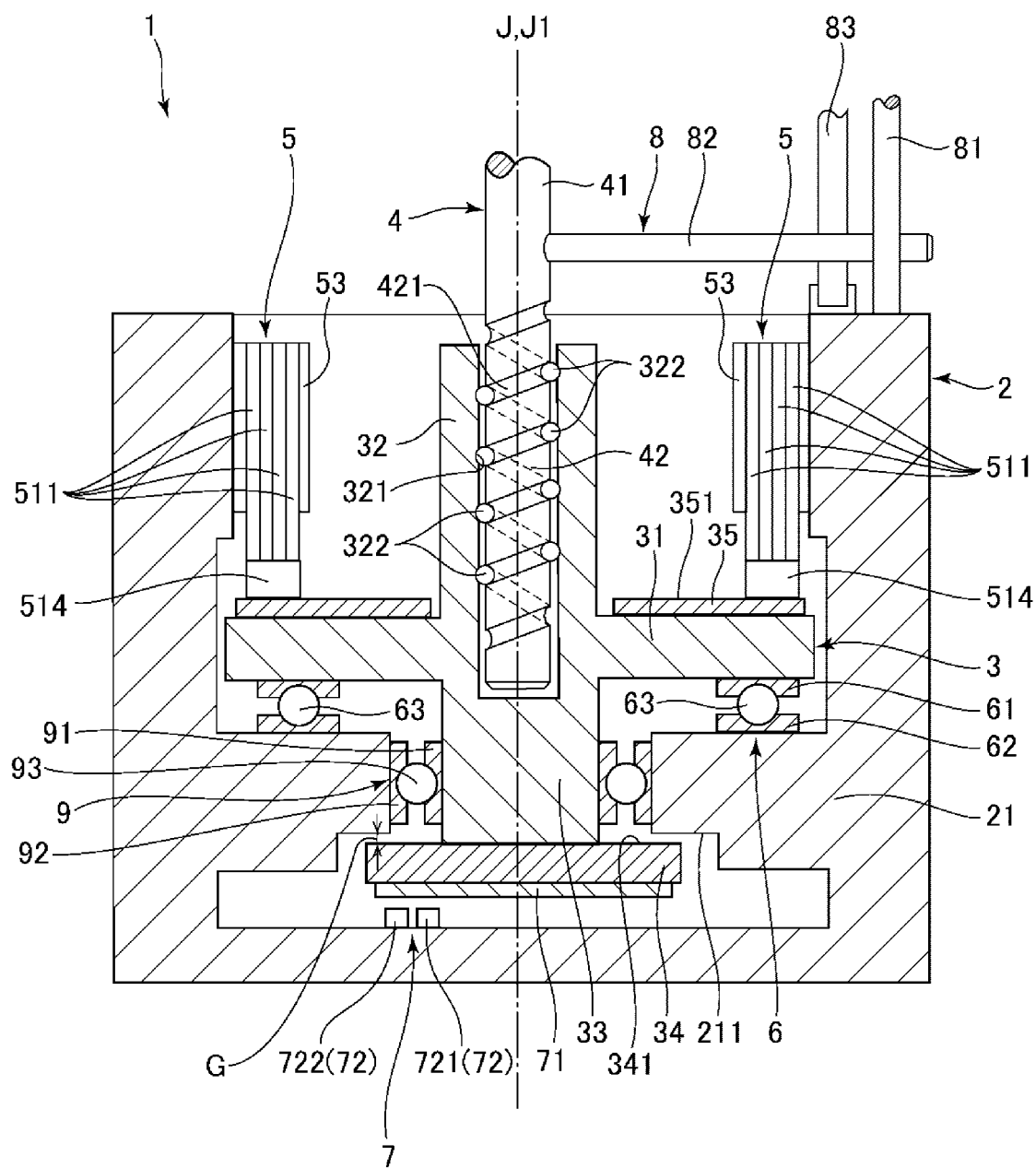
FIG. 1 is a cross-sectional view showing a rotary-to-linear motion converter according to a first embodiment of the present disclosure.
Figure 2:
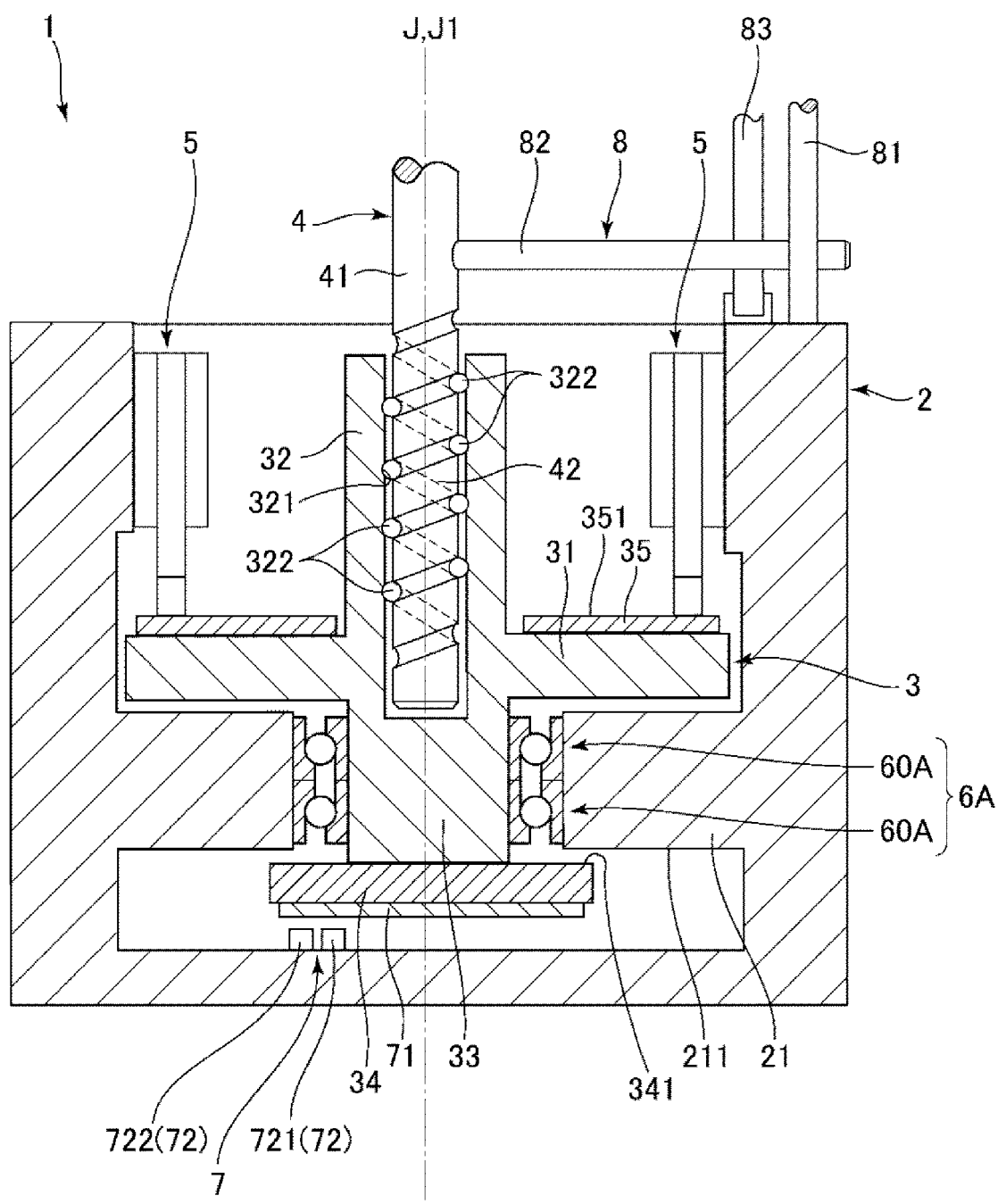
FIG. 2 is a cross-sectional view showing a modified example of the rotary-to-linear motion converter shown in FIG. 1.
Figure 3:
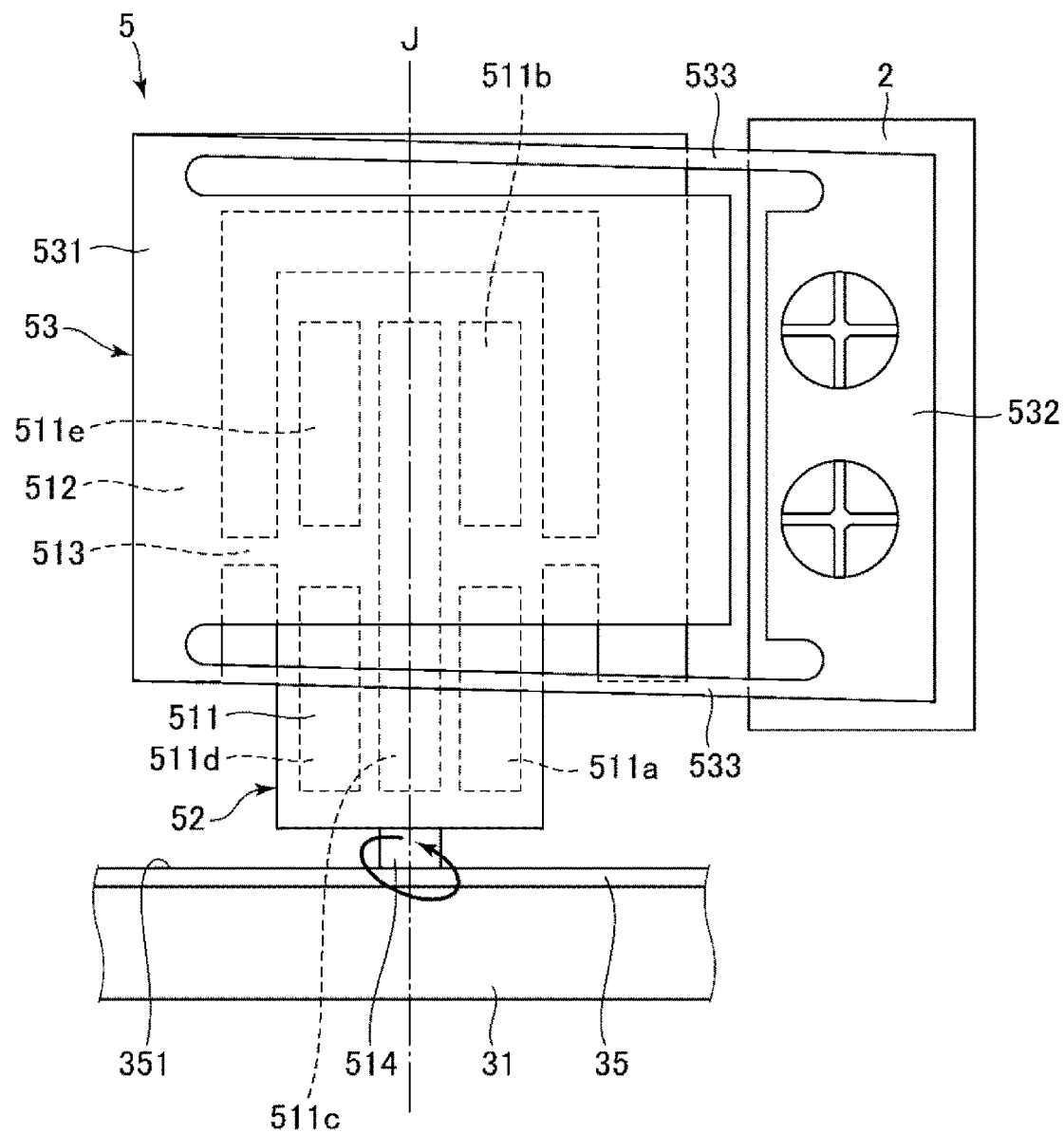
FIG. 3 is a plan view showing a piezoelectric motor included in the rotary-to-linear motion converter shown in FIG. 1.
Figure 4:
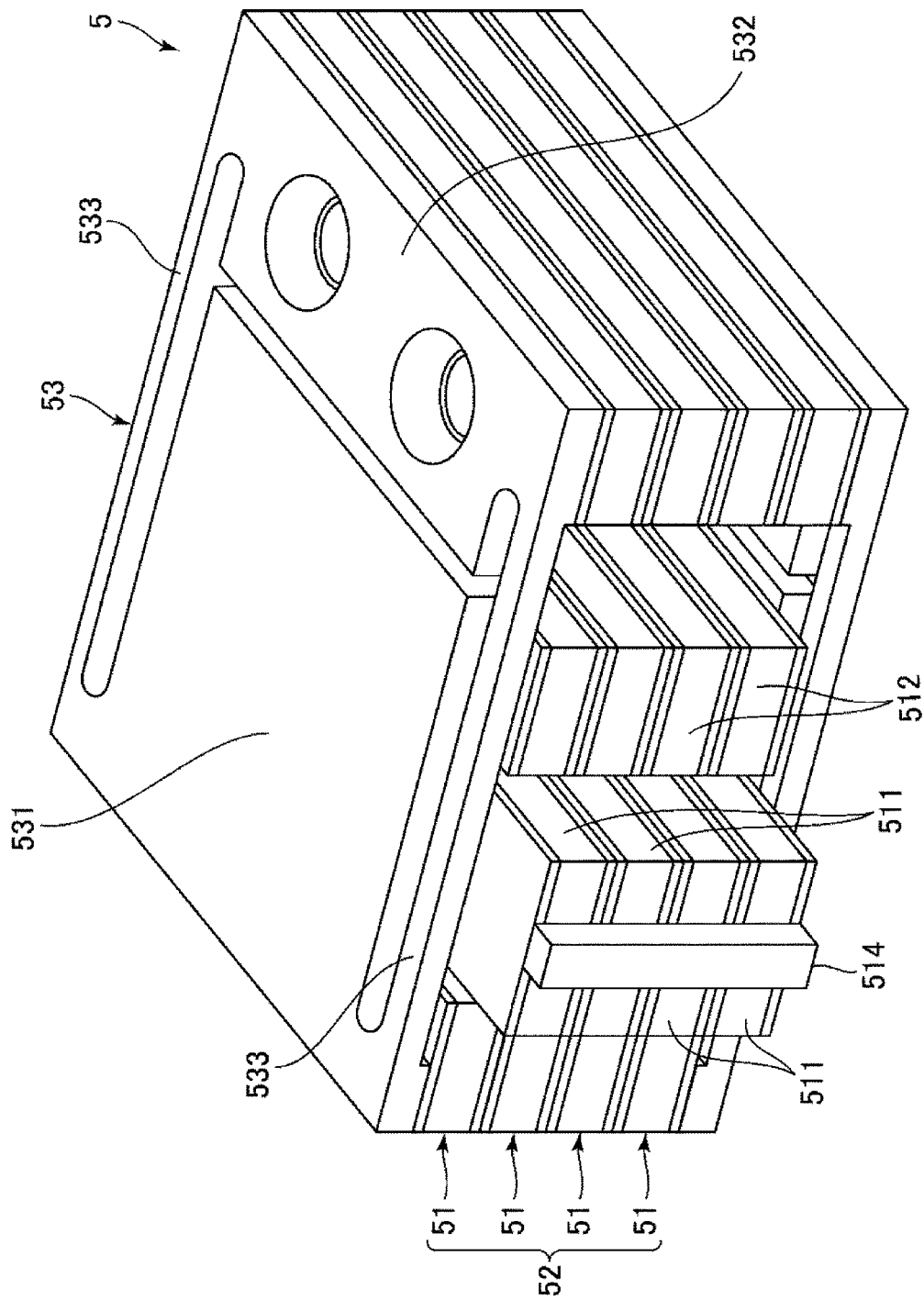
FIG. 4 is a perspective view of the piezoelectric motor shown in FIG. 3.
Figure 5:
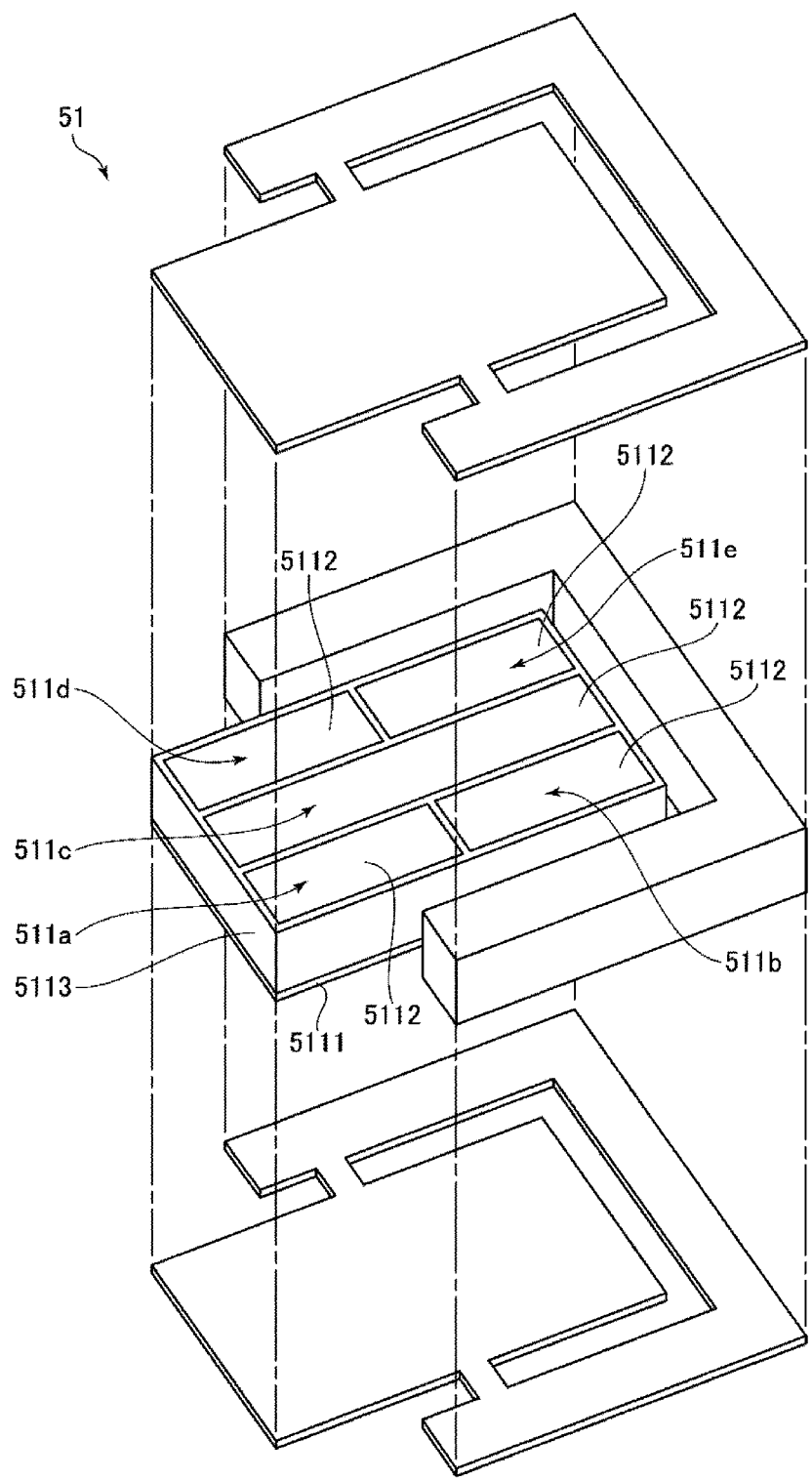
FIG. 5 is an exploded perspective view of a piezoelectric actuator included in the piezoelectric motor shown in FIG. 3.
Figure 6:
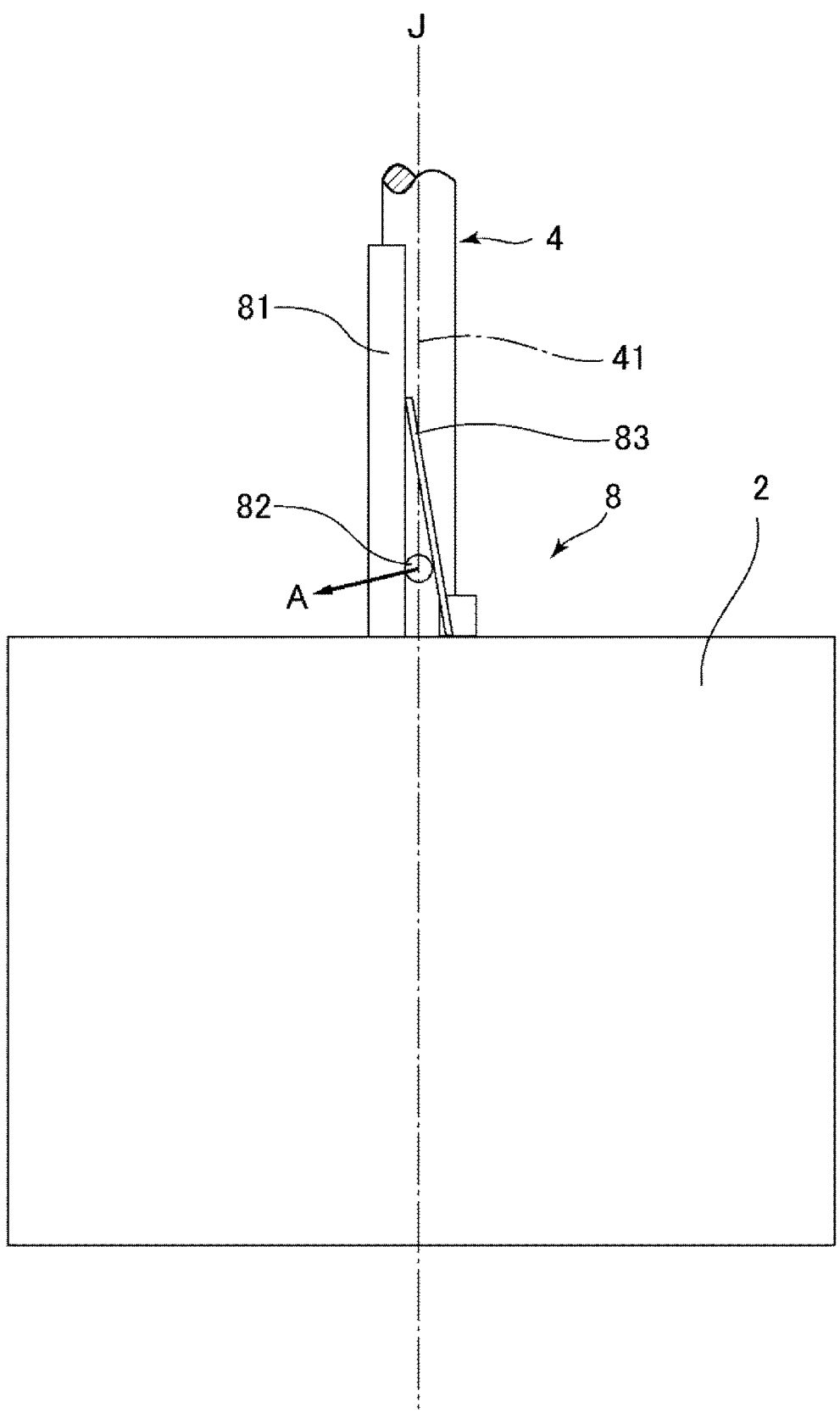
FIG. 6 is a side view of the rotary-to-linear motion converter shown in FIG. 1.

FIG. 1 is a cross-sectional view showing a rotary-to-linear motion converter according to a first embodiment of the present disclosure. FIG. 2 is a cross-sectional view showing a modified example of the rotary-to-linear motion converter shown in FIG. 1. FIG. 3 is a plan view showing a piezoelectric motor included in the rotary-to-linear motion converter shown in FIG. 1. FIG. 4 is a perspective view of the piezoelectric motor shown in FIG. 3. FIG. 5 is an exploded perspective view of a piezoelectric actuator included in the piezoelectric motor shown in FIG. 3. FIG. 6 is a side view of the rotary-to-linear motion converter shown in FIG. 1. In the following, for convenience of description, the upper side in FIG. 1 may also be referred to as "up", and the lower side may also be referred to as "down".

The rotary-to-linear motion converter 1 shown in FIG. 1 is used as, for example, a drive mechanism of a robot or a robot hand mounted on the robot. However, an apparatus in which the rotary-to-linear motion converter 1 is used is not particularly limited. The rotary-to-linear motion converter 1 can be used as, for example, a drive mechanism for driving a printer head and a drive mechanism of a light valve adjusting the light amount of a projector, besides a robot.

The rotary-to-linear motion converter 1 includes a base 2 (housing), a rotating member 3, a thrust bearing 6 and a radial bearing 9 that rotatably couple the rotating member 3 around a central axis J thereof relative to the base 2, piezoelectric motors 5 as piezoelectric drive portions rotating the rotating member 3, a rotary encoder 7 as a position detecting portion detecting the rotation amount of the rotating member 3, a linearly moving member 4 that threadably engages with the rotating member 3 and that performs a linear motion along the central axis J with the rotary motion of the rotating member 3, and a rotation restricting portion 8 restricting the rotary motion of the linearly moving member 4 around the central axis J while allowing the linear motion of the linearly moving member 4 along the central axis J.

In the rotary-to-linear motion converter 1 configured as described above, when the piezoelectric motor 5 is driven to rotate the rotating member 3 around the central axis J, the linearly moving member 4 linearly moves in a direction (the up-down direction in FIG. 1) along the central axis J. According to the rotary-to-linear motion converter 1, the rotary motion of the rotating member 3 can be converted to the linear motion of the linearly moving member 4 with a simple configuration. Especially, the piezoelectric motor 5 whose miniaturization is easier than that of an electromagnetic motor is used as a driving source to rotate the rotating member 3. Therefore, compared to a related-art configuration, the miniaturization of the rotary-to-linear motion converter 1 can be achieved. Hereinafter, the configuration of each portion included in the rotary-to-linear motion converter 1 will be successively described in detail.

The base 2 has a substantially tubular shape and is made of, for example, stainless steel. The rotating member 3 and the piezoelectric motors 5 are accommodated inside the base 2. However, the shape and material of the base 2 are not particularly limited.

The rotating member 3 includes a disk-shaped rotating body 31, a screw portion 32 as a second screw portion upwardly projecting from the center portion of the rotating body 31, a gap forming portion 33 downwardly projecting from the central portion of the rotating body 31, a stopper 34 as a restricting portion provided at the lower surface of the gap forming portion 33, and a ring-shaped driven member 35 disposed at the upper surface of the rotating body 31.

The screw portion 32 and the gap forming portion 33 are provided coaxially with the central axis J of the rotating body 31. Moreover, the screw portion 32 and the gap forming portion 33 are formed integrally with the rotating body 31. The rotating body 31, the screw portion 32, and the gap forming portion 33 are made of, for example, stainless steel. The rotating body 31 has a diameter larger than that of the screw portion 32 and the gap forming portion 33, and projects outward from the screw portion 32 and the gap forming portion 33 in a plan view as viewed in the direction along the central axis J. However, the rotating body 31, the screw portion 32, and the gap forming portion 33 are not limited to this configuration. For example, the screw portion 32 and the gap forming portion 33 may be each configured separately from the rotating body 31 and fixed to the rotating body 31 with adhesive, a screw, or the like.

The rotating body 31 is supported to the base 2 so as to be rotatable around the central axis J of the rotating body 31. The base 2 is provided with a rotating member support portion 21 that is positioned below the rotating body 31 and that faces the lower surface of the rotating body 31. The thrust bearing 6 as a bearing is provided between the rotating member support portion 21 and the rotating body 31, and the rotating body 31 is rotatably supported to the base 2 via the thrust bearing 6. By providing a bearing between the rotating body 31 and the rotating member support portion 21 as described above, the rotating body 31 can be smoothly rotated relative to the base 2.

The thrust bearing 6 includes an upper race 61 fixed to the lower surface of the rotating body 31, a lower race 62 fixed to the upper surface of the rotating member support portion 21, and a plurality of balls 63 disposed between the upper race 61 and the lower race 62. That is, the upper race 61, the ball 63, and the lower race 62 are arranged in the direction along the central axis J. With the use of the thrust bearing 6 as a bearing, the thrust direction of the thrust bearing 6 is along the central axis J, and therefore, force (axial load) along the central axis J can be effectively received by the thrust bearing 6. Therefore, the mechanical strength of the rotary-to-linear motion converter 1 can be increased.

The configuration of the thrust bearing 6 is not limited to the illustrated configuration. For example, the rotating body 31 may serve also as the upper race 61, and the rotating member support portion 21 may serve also as the lower race 62. That is, the rotating body 31 and the upper race 61 may be integrally formed together, and the rotating member support portion 21 and the lower race 62 may be integrally formed together. Moreover, the thrust bearing 6 is not particularly limited, and any bearing can be selected for use from, for example, a thrust ball bearing, a thrust angular ball bearing, a thrust cylindrical roller bearing, a thrust needle roller bearing, a thrust tapered roller bearing, a thrust self-aligning roller bearing, and the like.

The radial bearing 9 includes an inner race 91 fixed to the side surface of the gap forming portion 33, an outer race 92 fixed to the inner surface of the rotating member support portion 21, and a plurality of balls 93 disposed between the inner race 91 and the outer race 92. With the use of the radial bearing 9 in addition to the thrust bearing 6, force (radial load) along a direction orthogonal to the central axis J can be effectively received by the radial bearing 9. Therefore, the mechanical strength of the rotary-to-linear motion converter 1 can be increased. Moreover, in both directions of the direction along the central axis J and a plane direction orthogonal to the central axis J, positioning of the rotating member 3 can be performed relative to the base 2. Therefore, the rotating member 3 can be more smoothly rotated relative to the base 2.

The bearing is not limited to the configuration shown in FIG. 1, and for example, a combination angular bearing 6A as shown in FIG. 2 may be used. The combination angular bearing 6A is a back-to-back combination angular bearing including two angular bearings 60A combined together. Besides the back-to-back combination angular bearing, a face-to-face combination angular bearing or a tandem combination angular bearing may be used.

The stopper 34 is fixed to the lower surface of the gap forming portion 33. The fixing method of the gap forming portion 33 and the stopper 34 is not particularly limited, and for example, adhesive, screwing, or the like can be used. The stopper 34 has a disk shape. The stopper 34 has a diameter larger than that of the gap forming portion 33, and projects outward from the gap forming portion 33 in a plan view as viewed in the direction along the central axis J. The stopper 34 is positioned below the rotating member support portion 21, and the outer edge portion of an upper surface 341 of the stopper 34 faces a lower surface 211 of the rotating member support portion 21. In other words, the rotating member support portion 21 is positioned in a space formed due to the gap forming portion 33 between the rotating body 31 and the stopper 34. The upper surface 341 of the stopper 34 and the lower surface 211 of the rotating member support portion 21 are in non-contact with each other, and a gap G therebetween is sufficiently narrow.

According to the configuration described above, for example, even when the rotating member 3 is upwardly displaced relative to the base 2 due to an impact such as vibration or falling, the stopper 34 comes in contact with the rotating member support portion 21 and thus restricts a further displacement of the rotating member 3. Therefore, the rattling of the thrust bearing 6 in the thrust direction can be minimized, and also, the detachment of the rotating member from the base 2 can be prevented. The gap G is not particularly limited, and is preferably set to, for example, 0.01 mm or more and 0.1 mm or less. With this configuration, the rattling of the thrust bearing 6 in the thrust direction can be sufficiently minimized. As a modified example of the embodiment, for example, the thrust bearing 6 may be provided also between the stopper 34 and the rotating member support portion 21. In the embodiment, there is a risk that the thrust bearing 6 may rattle in the thrust direction by an amount corresponding to the gap G. According to the configuration described above, however, the gap G is not present, and therefore, the rattling of the thrust bearing 6 in the thrust direction can be substantially eliminated.

The rotary encoder 7 for detecting the rotational displacement amount of the rotating body 31 is provided below the stopper 34. By disposing the rotary encoder 7 below the rotating member 3 as described above, the rotary encoder 7 can be disposed at the opposite side from the linearly moving member relative to the rotating member 3, which sufficiently increases the degree of freedom in the arrangement of the rotary encoder 7. The rotary-to-linear motion converter 1 can detect the linear displacement amount of the linearly moving member 4 based on the rotational displacement amount of the rotating body 31 detected by the rotary encoder 7. Therefore, by feeding back the detection result of the rotary encoder 7 to the driving of the piezoelectric motor 5, the linear motion of the linearly moving member 4 can be accurately controlled.

The rotary encoder 7 may be an incremental encoder detecting the rotational displacement amount of the rotating body 31 at the time of rotation, or may be an absolute encoder detecting the absolute position of the rotating body 31 from the starting point irrespective of the presence or absence of rotation of the rotating body 31. In the embodiment, the absolute encoder is used as the rotary encoder 7. With the use of the absolute encoder, the current position (the moving amount from the starting point) of the linearly moving member 4 can be easily detected.

The rotary encoder 7 includes a scale 71 fixed to the lower surface of the stopper 34 and an optical device 72 that is provided below the scale 71 and that is fixed to the base 2. The scale 71 has a disk shape and is provided with a pattern (not shown) at the lower surface thereof. On the other hand, the optical device 72 includes a light emitting element 721 emitting light onto the pattern of the scale 71 and an imaging device 722 imaging the pattern of the scale 71. In the rotary encoder 7 configured as described above, the absolute position of the rotating body 31 from the starting point can be detected by performing template matching on the image of the pattern obtained by the imaging device 722.

Although a case in which the rotary encoder 7 is used as a position detecting portion has been described above, the configuration of the position detecting portion is not particularly limited as long as the linear displacement amount or current position of the linearly moving member 4 can be detected. For example, a linear encoder including the optical device fixed to the base and the scale fixed to the linearly moving member 4 may be used as the position detecting portion.

Returning to the description of the rotating member 3, the screw portion 32 disposed coaxially with the central axis J and the ring-shaped driven member 35 disposed coaxially with the central axis J and surrounding the screw portion 32 in a plan view are provided at the upper surface of the rotating body 31. The screw portion 32 has a tube shape, and a spiral groove 321 along the central axis J is formed at the inner circumferential surface of the screw portion 32. The screw portion 32 is a ball screw nut and includes a path (not shown) for endless circulation of a plurality of balls 322 engaging with the groove 321.

The driven member 35 is a member to come in contact with the piezoelectric motor 5. The upper surface of the driven member 35 is a driven surface 351 to come in contact with the piezoelectric motor 5. The driven surface 351 is orthogonal to the central axis J. The constituent material of the driven member 35 is not particularly limited, and is preferably material having excellent wear resistance. Examples of the material having excellent wear resistance include, for example, various ceramics such as oxide ceramics including alumina, silica, titania, and zirconia and nitride ceramics including silicon nitride, aluminum nitride, and titanium nitride, sapphire, and quartz crystal. Although the rotating body 31 and the driven member 35 are separately formed in the embodiment, the rotating body 31 and the driven member 35 are not limited to this configuration and may be integrally formed together. That is, the rotating body 31 may serve also as the driven member 35, and the upper surface of the rotating body 31 may be the driven surface 351.

As shown in FIGS. 3 and 4, the piezoelectric motor includes a stacked body 52 in which a plurality of piezoelectric actuators 51 are stacked, and a biasing member 53 biasing the stacked body 52 toward the driven surface 351. The biasing member 53 includes a support portion 531 supporting the stacked body 52, a fixed portion 532 fixed to the base 2, and a pair of beam portions 533 coupling the support portion 531 to the fixed portion 532.

As shown in FIG. 3, each of the piezoelectric actuators 51 includes a vibrating portion 511 having a longitudinal shape, a support portion 512 supporting the vibrating portion 511, a pair of coupling portions 513 coupling the vibrating portion 511 to the support portion 512, and a convex portion 514 that is provided at the tip portion of the vibrating portion 511 and that transmits the driving force of the vibrating portion 511 to the driven member 35. The piezoelectric actuator 51 is fixed to the support portion 531 of the biasing member 53 in the support portion 512. The convex portion 514 is provided projecting from the vibrating portion 511. The tip portion of the convex portion 514 is pressed by the biasing member 53 against the driven surface 351.

The constituent material of the convex portion 514 is not particularly limited, and is preferably material having excellent wear resistance. Examples of the material having excellent wear resistance include, for example, various ceramics such as oxide ceramics including alumina, silica, titania, and zirconia and nitride ceramics including silicon nitride, aluminum nitride, and titanium nitride, sapphire, and quartz crystal.

The vibrating portion 511 is provided with piezoelectric elements 511$a$, 511$b$, 511$c$, 511$d$, and 511$e$. As shown in FIG. 5, each of the piezoelectric elements 511$a$ to 511$e$ includes a pair of electrodes 5111 and 5112 and a piezoelectric body 5113 interposed between the pair of electrodes. Each of the piezoelectric elements 511$a$ to 511$e$ can expand and contract in the longitudinal direction of the vibrating portion 511. The electrode 5111 is common to the piezoelectric elements 511$a$ to 511$e$. The electrodes 5112 are divided electrodes corresponding to the piezoelectric elements 511$a$ to 511$e$. By the application of a predetermined drive signal to each of the piezoelectric elements 511$a$, 511$b$, 511$c$, 511$d$, and 511$e$, the vibrating portion 511 performs in-plane vibration, and according to the vibration, the convex portion 514 performs an elliptical motion. The driven member 35 is sent due to the elliptical motion of the convex portion 514, and the rotating member 3 rotates (positively rotates/negatively rotates) around the central axis J relative to the base 2.

In a state in which the driving of the piezoelectric motor 5 is stopped, that is, in a state in which the convex portion 514 stops its elliptical motion, the convex portion 514 is pressed by the biasing member 53 against the driven surface 351. Therefore, the rotation of the rotating member 3 is blocked by frictional force generated between the convex portion 514 and the driven surface 351, and the position of the rotating member 3 is maintained. That is, according to the piezoelectric motor 5, the rotation of the rotating member can be blocked only by stopping the driving of the piezoelectric motor 5 without separately providing a brake mechanism. Therefore, the miniaturization of the rotary-to-linear motion converter 1 can be achieved.

As the constituent material of the piezoelectric body 5113 included in the piezoelectric elements 511$a$ to 511$e$, piezoelectric ceramics such as lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, and lead scandium niobate can be used. A piezoelectric body made of piezoelectric ceramics may be formed using, for example, a sol-gel method or a sputtering method, and may be formed from bulk material. As the constituent material of the piezoelectric body 5113, polyvinylidene fluoride, quartz crystal, or the like may be used besides the piezoelectric ceramics described above.

The piezoelectric motor 5 has been described above. When the same torque is generated, it is easy to miniaturize the piezoelectric motor 5 compared to an electromagnetic motor as in the related art. Hence, with the use of the piezoelectric motor 5 as a driving source to rotate the rotating member 3, the miniaturization of the rotary-to-linear motion converter 1 can be achieved.

The configuration of the piezoelectric motor 5 is not particularly limited as long as the driven member 35 can be rotated by the vibration of a piezoelectric element. For example, although the stacked body 52 in which the plurality of piezoelectric actuators 51 are stacked is used in the embodiment, the piezoelectric motor 5 is not limited to this configuration and may use one piezoelectric actuator 51. Moreover, although the vibrating portion 511 is configured to perform in-plane vibration in the embodiment, the vibrating portion 511 is not limited to this configuration and may be configured to perform out-of-plane vibration, that is, to vibrate in the thickness direction.

As shown in FIG. 3, the vibrating portion 511 and the convex portion 514 are disposed along the central axis J. In other words, the longitudinal direction of the vibrating portion 511 is parallel to the central axis J. By disposing the piezoelectric motor 5 in the attitude described above, the planar expansion (expansion in the direction orthogonal to the central axis J) of the piezoelectric motor 5 can be suppressed. Therefore, the miniaturization of the rotary-to-linear motion converter 1 can be achieved.

The piezoelectric motor 5 and the linearly moving member 4 are arranged in the direction orthogonal to the central axis J. In other words, as viewed in the direction orthogonal to the central axis J, the piezoelectric motor 5 is disposed so as to overlap the linearly moving member 4. With this configuration, a space around the linearly moving member 4 can be effectively used as the arrangement space of the piezoelectric motor 5. Therefore, a dead space can be reduced, and the miniaturization of the rotary-to-linear motion converter 1 can be achieved.

In the embodiment, two piezoelectric motors 5 as piezoelectric drive portions are provided (see FIG. 1). By disposing the plurality of piezoelectric motors 5 as described above, the rotating member 3 can be rotated with higher torque. The two piezoelectric motors 5 are disposed so as to interpose the central axis J therebetween in a plan view as viewed in the direction along the central axis J. That is, one piezoelectric motor 5 is disposed at one side of the central axis J, and one piezoelectric motor 5 is disposed also at the other side. Especially in the embodiment, the two piezoelectric motors 5 are disposed at equal angular intervals along the circumferential direction of the rotating body 31. With this configuration, the two piezoelectric motors 5 can be disposed in a well-balanced manner, and also, interference of the two piezoelectric motors 5 can be effectively reduced. However, the number of the piezoelectric motors 5 is not particularly limited, and can be appropriately set depending on the size of the arrangement space, required torque, and the like. The number of the piezoelectric motors 5 may be one, or may be three or more.

As shown in FIG. 1, the linearly moving member 4 has an axial center J1 coincident with the central axis J. The linearly moving member 4 includes a columnar (rod-like) axial portion 41 extending along the central axis J and a screw portion 42 as a second screw portion including a spiral groove 421 provided at the axial portion 41 along the central axis J (the axial center J1). The linearly moving member 4 is made of, for example, stainless steel. However, the shape and material of the linearly moving member 4 are not particularly limited.

The groove 421 threadably engages with the groove 321 of the screw portion 32 via the plurality of balls 322. With the threadable engagement of the grooves 421 and 321 via the balls 322 as described above, that is, by forming the grooves and the balls in a ball screw structure, backlash can be reduced.

By the rotation restricting portion 8, the linear motion of the linearly moving member 4 along the central axis J is allowed, and also, the rotary motion thereof around the central axis J is restricted. Therefore, when the rotating member 3 rotates, the linearly moving member 4 linearly moves along the central axis J without rotating together with the rotating member 3. By coupling the rotating member 3 to the linearly moving member 4 through threadable engagement as described above, the rotary motion of the rotating member 3 can be easily converted to the linear motion of the linearly moving member 4. Here, a self-locking configuration may be employed by sufficiently reducing the lead angle of the grooves 421 and 321. With this configuration, the rotation of the rotating member 3 by force in the direction along the central axis J applied to the linearly moving member 4 can be suppressed.

Although the grooves 421 and 321 threadably engage with each other via the balls 322 in the embodiment, the grooves 421 and 321 are not limited to this configuration. For example, the grooves 421 and 321 may directly threadably engage with each other without the balls 322. Moreover, the screw shape is not particularly limited, and a square screw, a trapezoidal screw, an involute screw, or the like may be employed.

As shown in FIG. 6, the rotation restricting portion 8 includes a guide member 81 that is fixed to the base 2 and that extends along the central axis J, a following member 82 that is fixed to the linearly moving member 4 and that extends in the direction orthogonal to the central axis J, and a biasing member 83 that biases the following member 82 to press the following member 82 against the guide member 81. With the following member 82 biased to the guide member 81 by the biasing member 83, the rotary motion of the linearly moving member 4 is restricted. On the other hand, with the following member 82 sliding with the guide member 81, the linear motion of the linearly moving member 4 along the central axis J is allowed. Especially in the embodiment, the guide member 81 and the following member 82 each have a cylindrical shape and therefore are substantially in point contact with each other. Therefore, a sliding resistance between the guide member 81 and the following member 82 can be sufficiently reduced, and the linear motion of the linearly moving member 4 along the central axis J can be more smoothly performed with smaller force.

The biasing member 83 includes a plate spring with its one end portion fixed to the base 2. The biasing member 83 is disposed inclined to the central axis J and biases the following member 82 in the direction of an arrow A shown in FIG. 6. That is, the biasing member 83 biases the following member 82 in the direction orthogonal to the central axis J to press the following member 82 against the guide member 81, and also biases the following member 82 in the direction along the central axis J to press the following member 82 against the rotating member 3. With this configuration, the rattling of the linearly moving member 4 in the rotational direction and the rattling of the linearly moving member 4 in the direction along the central axis J can be reduced. Therefore, the linearly moving member 4 can accurately perform a linear motion.

The configuration of the rotation restricting portion 8 is not particularly limited. For example, the biasing member 83 is not a plate spring but may be a coil spring. Moreover, for example, the rotation restricting portion 8 may be configured to include a concave portion that is formed at the outer circumference of the linearly moving member 4 and that extends along the central axis J, and a convex portion that engages with the concave portion and that is fixed to the base 2. In this case, the concave portion and the convex portion may be inversely disposed.

The rotary-to-linear motion converter 1 has been described above. As described above, the rotary-to-linear motion converter 1 includes: the piezoelectric motor 5 as a drive portion including the vibrating portion 511 vibrating by the piezoelectric body 5113 and the convex portion 514 coupled to the vibrating portion 511; the base 2 as a housing; the rotating member 3 including the screw portion 32 as the first screw portion and the driven surface 351 contacting the convex portion 514 and receiving the driving force of the piezoelectric motor 5, and pivoting around the axial center J1 relative to the base 2; the linearly moving member 4 including the screw portion 42 as the second screw portion threadably engaging with the screw portion 32; and the rotation restricting portion 8 as a restricting portion disposed at the base 2 and restricting the rotation of the linearly moving member 4. According to the rotary-to-linear motion converter 1 configured as described above, the linearly moving member 4 and the rotating member 3 are threadably engaged with each other, and therefore, the rotary motion of the rotating member 3 can be converted to the linear motion of the linearly moving member 4 with a simple configuration. Moreover, because of the use of the piezoelectric motor 5, the miniaturization of the rotary-to-linear motion converter 1 can be achieved compared to when an electromagnetic motor is used as in the related art.

As described above, the driven surface 351 is orthogonal to the axial center J1, and the vibrating portion 511 and the convex portion 514 are arranged along the axial center J1. With this configuration, the expansion of the piezoelectric motor 5 in the direction orthogonal to the axial center J1 can be suppressed. Therefore, the miniaturization of the rotary-to-linear motion converter 1 can be achieved.

As described above, the rotary-to-linear motion converter 1 includes the base 2 supporting the rotating member 3, and the thrust bearing 6 as a bearing positioned between the rotating member 3 and the base 2. With this configuration, the rotating member 3 can be smoothly rotated relative to the base 2. Especially, the bearing is the thrust bearing 6, and the thrust direction of the thrust bearing 6 is along the axial center J1. With this configuration, force along the axial center J1 can be effectively received by the thrust bearing 6. Therefore, the mechanical strength of the rotary-to-linear motion converter 1 can be increased.

As described above, the rotary-to-linear motion converter 1 includes the stopper 34 as a restricting portion restricting the displacement of the rotating member 3 in the direction along the axial center J1. With this configuration, the detachment of the rotating member 3 from the base 2 can be suppressed.

Second Embodiment

Figure 7:
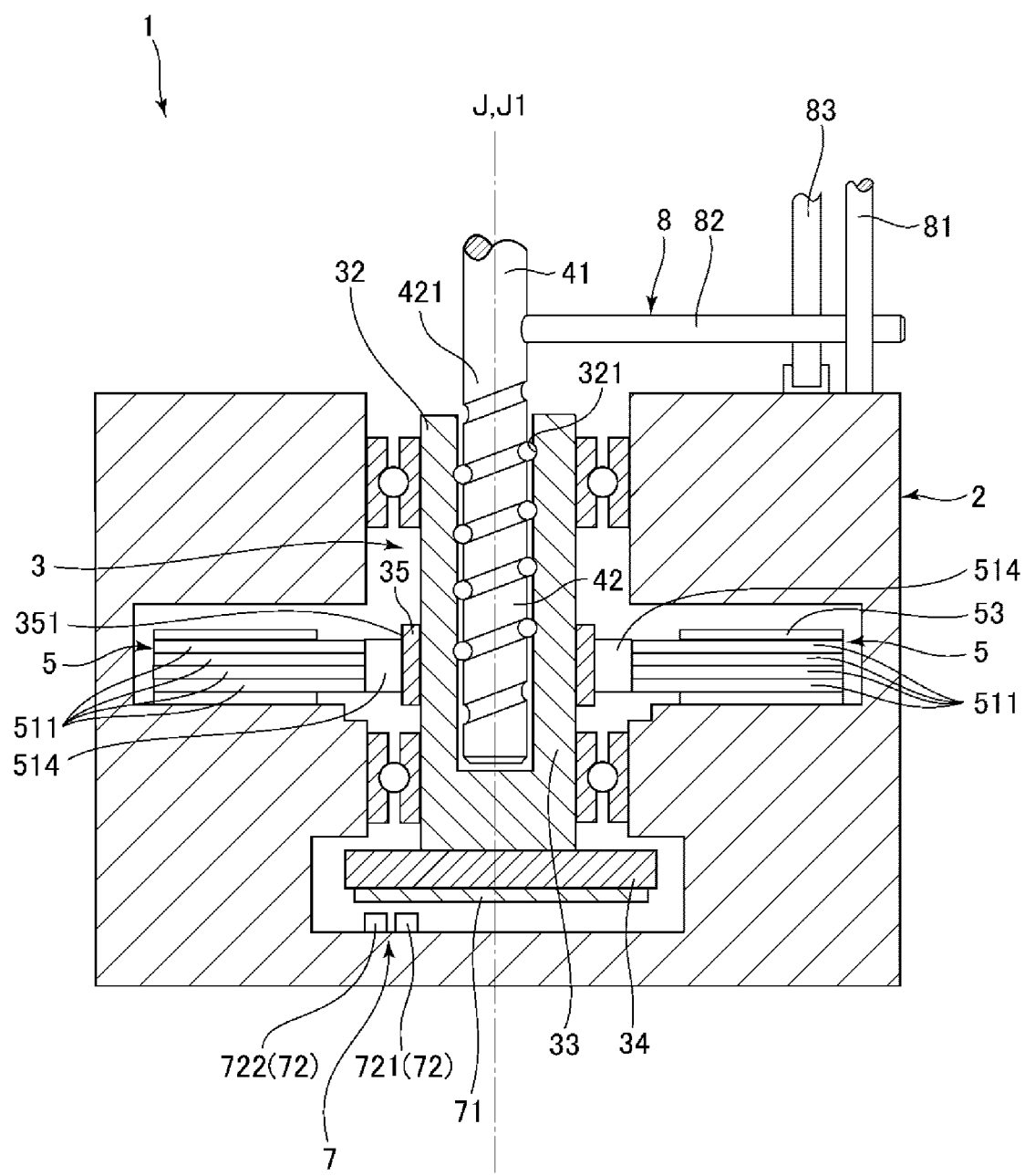
FIG. 7 is a cross-sectional view showing a rotary-to-linear motion converter according to a second embodiment of the present disclosure.

FIG. 7 is a cross-sectional view showing a rotary-to-linear motion converter according to a second embodiment of the present disclosure.

The rotary-to-linear motion converter 1 according to the embodiment is similar to the rotary-to-linear motion converter according to the first embodiment described above, excepting that the arrangement of the piezoelectric motor 5 and the driven surface 351 is different. In the following description, the rotary-to-linear motion converter 1 according to the second embodiment will be described focusing on differences from that of the first embodiment described above, and the description of similar matters will be omitted. In FIG. 7, configurations similar to those of the embodiment described above are denoted by the same reference numerals and signs.

As shown in FIG. 7, in the rotary-to-linear motion converter 1 according to the embodiment, the driven member 35 has a circular tube shape and is disposed coaxially with the central axis J (the axial center J1). The outer circumferential surface of the driven member 35 is the driven surface 351. Therefore, the driven surface 351 is parallel to the central axis J.

In the piezoelectric motor 5, the vibrating portion 511 and the convex portion 514 are disposed along the direction orthogonal to the central axis J. In other words, the longitudinal direction of the vibrating portion 511 is orthogonal to the central axis J, and the thickness direction of the vibrating portion 511 is along the central axis J. By disposing the piezoelectric motor 5 in the attitude described above, it is easy to press the convex portion 514 against the driven surface 351. Moreover, for example, compared to the first embodiment described above, the expansion (expansion in the direction along the central axis J) of the piezoelectric motor 5 in the height direction can be suppressed. Therefore, a reduction in height of the rotary-to-linear motion converter 1 can be achieved.

As described above, in the rotary-to-linear motion converter 1 according to the embodiment, the driven surface 351 is a cylindrical surface located around the axial center J1, and the vibrating portion 511 and the convex portion 514 are arranged in the direction orthogonal to the axial center J1. By employing the configuration described above, it is easy to press the convex portion 514 against the driven surface 351, and also, a reduction in height of the rotary-to-linear motion converter 1 can be achieved.

Although the rotary-to-linear motion converter according to the present disclosure has been described above based on the illustrated embodiments, the present disclosure is not limited to the embodiments. The configuration of each portion can be replaced with any configuration having a similar function. Moreover, any other configurations may be added to the present disclosure. Moreover, the embodiments may be appropriately combined.

What is claimed is:
1. A rotary-to-linear motion converter comprising:
  a drive portion including
    a vibrating portion vibrating by a piezoelectric body and
    a convex portion coupled to the vibrating portion;
  a housing;
  a rotating member including a first screw portion which has a tube shape and
a driven surface that contacts the convex portion and that receives driving force of the drive portion,
the rotating member pivoting around an axial center relative to the housing;
a base supporting the rotating member;
a linearly moving member including a columnar axial portion extending along a central axis and a second screw portion being provided at one end of the columnar axial portion along the central axis and inserted into the tubular first screw portion for threadably engaging with the first screw portion; and
a first restricting portion that is disposed at the housing and that is fixed to a driving end of the linearly moving member to restricts rotation of the linearly moving member,
wherein the driving end is the other end of the columnar axial portion opposite to the one end of the columnar axial portion,
wherein the first restricting portion includes a guide member that is fixed to the base and that extends along the central axis, a following member that is fixed to the linearly moving member and that extends in the direction orthogonal to the central axis, and a biasing member that biases the following member to press the following member against the guide member.

2. The rotary-to-linear motion converter according to claim 1, wherein
the driven surface is orthogonal to the axial center, and
the vibrating portion and the convex portion are arranged in a direction parallel to the axial center.

3. The rotary-to-linear motion converter, according to claim 1, wherein
the driven surface is a cylindrical surface located around the axial center, and
the vibrating portion and the convex portion are arranged in a direction orthogonal to the axial center.

4. The rotary-to-linear motion converter according to claim 1, further comprising:
a base supporting the rotating member; and a bearing positioned between the rotating member and the base.

5. The rotary-to-linear motion converter according to claim 4, wherein
the bearing is a thrust bearing, and
a thrust direction of the thrust bearing is along the axial center.

6. The rotary-to-linear motion converter according to claim 1, wherein the housing is provided with a rotating member support portion that is positioned below the driven surface, the rotary-to-linear motion converter further comprises a second restricting portion disposed below the rotating member and restricting displacement of the rotating member in a direction along the axial center by bringing the second restricting portion into contact with the rotating member support portion.

* * * * *